United States Patent
Yi et al.

(10) Patent No.: US 12,191,832 B2
(45) Date of Patent: Jan. 7, 2025

(54) LOAD-MODULATED BALANCED AMPLIFIER (LMBA) BASED ON VARIABLE CROSS-COUPLED PAIR (XCP)

(71) Applicant: CHENGDU FLUXWORKS TECHNOLOGY CO., LTD, Chengdu (CN)

(72) Inventors: Kai Yi, Chengdu (CN); Kai Kang, Chengdu (CN); Chenxi Zhao, Chengdu (CN); Huihua Liu, Chengdu (CN)

(73) Assignee: CHENGDU FLUXWORKS TECHNOLOGY CO., LTD, Chengdu (CN)

( * ) Notice: Subject to any disclaimer, the term of this patent is extended or adjusted under 35 U.S.C. 154(b) by 0 days.

(21) Appl. No.: 18/566,099

(22) PCT Filed: May 26, 2023

(86) PCT No.: PCT/CN2023/096529
§ 371 (c)(1),
(2) Date: Dec. 1, 2023

(87) PCT Pub. No.: WO2024/055632
PCT Pub. Date: Mar. 21, 2024

(65) Prior Publication Data
US 2024/0267015 A1    Aug. 8, 2024

(30) Foreign Application Priority Data

Sep. 16, 2022  (CN) .......................... 202211131218.1

(51) Int. Cl.
*H03G 3/00*  (2006.01)
*H03F 1/08*  (2006.01)
*H03F 3/45*  (2006.01)

(52) U.S. Cl.
CPC ............. *H03G 3/007* (2013.01); *H03F 1/086* (2013.01); *H03F 3/45264* (2013.01); *H03F 2200/451* (2013.01)

(58) Field of Classification Search
CPC ..... H03G 3/007; H03F 1/086; H03F 3/45264; H03F 2200/451
(Continued)

(56) References Cited

U.S. PATENT DOCUMENTS

2021/0218375 A1* 7/2021 Sharma .................... H03F 3/195

FOREIGN PATENT DOCUMENTS

| CN | 114172462 A | 3/2022 |
|----|-------------|--------|
| CN | 114172469 A | 3/2022 |

(Continued)

OTHER PUBLICATIONS

Razavi, Behzad, The Cross-Coupled Pair—Part I, IEEE Solid-State Circuits Magazine, Summer 2014 (Year: 2014).*

(Continued)

*Primary Examiner* — Hafizur Rahman

(57) ABSTRACT

A load-modulated balanced amplifier (LMBA) based on a variable cross-coupled pair (XCP) is provided. The LMBA includes an adaptive bias (ADB) circuit, a first balance terminal amplifier module, a second balance terminal amplifier module, a control terminal amplifier module, a first driver amplifier module, a second driver amplifier module, a third driver amplifier module, a variable XCP, a resistor R5, a resistor R6, a 90-degree differential coupler Q1, a 90-degree differential coupler Q2, and a 90-degree differential coupler Q3.

9 Claims, 5 Drawing Sheets

(58) Field of Classification Search
USPC .......................................................... 330/285
See application file for complete search history.

(56) References Cited

FOREIGN PATENT DOCUMENTS

| CN | 114337565 A | 4/2022 |
| CN | 115603672 A | 1/2023 |

OTHER PUBLICATIONS

Razavi, Behzad, The Cross-Coupled Pair—Part II, IEEE Solid-State Circuits Magazine, Summer 2014 (Year: 2014).*
Razavi, Behzad, The Cross-Coupled Pair—Part III, IEEE Solid-State Circuits Magazine, Summer 2014 (Year: 2014).*

* cited by examiner

LOAD-MODULATED BALANCED AMPLIFIER (LMBA) BASED ON VARIABLE CROSS-COUPLED PAIR (XCP)

CROSS REFERENCE TO THE RELATED APPLICATIONS

This application is the national phase entry of International Application No. PCT/CN2023/096529, filed on May 26, 2023, which is based upon and claims priority to Chinese Patent Application No. 202211131218.1, filed on Nov. 16, 2022, the entire contents of which are incorporated herein by reference.

TECHNICAL FIELD

The present disclosure relates to the technical field of wireless communications, and in particular to a load-modulated balanced amplifier (LMBA) based on a variable cross-coupled pair (XCP).

BACKGROUND

With the emergence of fifth-generation (5G) wireless communication systems, increasingly high requirements are imposed on the data rate. Due to scarce spectrum resources, low-latency and large-capacity wireless connections require advanced modulation schemes to improve the utilization rate of the spectrum resources. However, these complicated modulated wireless waves have a high peak-to-average power ratio (PAPR) that greatly reduces efficiency of a conventional power amplifier. In order to improve the efficiency of the power amplifier for amplifying signals with a high PAPR, a load-modulated balanced amplifier (LMBA) has been proposed in recent years. The LMBA includes a balance terminal amplifier and a control terminal amplifier. Load modulation is realized by changing the ratio of the output power of a control terminal amplifier to the output power of a balance terminal amplifier. The balance terminal amplifier works in a class-C mode, while the control terminal amplifier works in a class-AB mode.

The class-AB amplifier and the class-C amplifier are greatly different in gain in the millimeter-wave frequency band. The class-C amplifier has a very low gain. After the balance terminal amplifier is turned on, the overall gain of the amplifier is reduced dramatically with an increase of input power, and thus the linearity of the amplifier is seriously affected. This restricts application of the LMBA in the millimeter-wave frequency band.

SUMMARY

In view of shortages in the prior art, the present disclosure provides an LMBA based on a variable XCP, to solve the problem that a class-AB amplifier and a class-C amplifier are greatly different in gain in a millimeter wave band to restrict an application of the LMBA in the millimeter-wave frequency band.

To achieve the above objective, the present disclosure adopts the following technical solutions:

An LMBA based on a variable XCP includes an adaptive bias (ADB) circuit, a first balance terminal amplifier module, a second balance terminal amplifier module, a control terminal amplifier module, a first driver amplifier module, a second driver amplifier module, a third driver amplifier module, a variable XCP, a resistor R5, a resistor R6, a 90-degree differential coupler Q1, a 90-degree differential coupler Q2, and a 90-degree differential coupler Q3, where an input terminal of the ADB circuit and a third input terminal of the 90-degree differential coupler Q1 each serve as an input terminal of an amplifier; one terminal of an isolated terminal of the 90-degree differential coupler Q1 is connected to the other terminal of the isolated terminal of the 90-degree differential coupler Q1 through the resistor R5; a pass-through terminal of the 90-degree differential coupler Q1 includes one terminal connected to a first input terminal of the 90-degree differential coupler Q2, and the other terminal connected to a second input terminal of the 90-degree differential coupler Q2; one terminal of an isolated terminal of the 90-degree differential coupler Q2 is connected to the other terminal of the isolated terminal of the 90-degree differential coupler Q2 through the resistor R6; a third output terminal of the 90-degree differential coupler Q1 is connected to an input terminal of the third driver amplifier module; an output terminal of the third driver amplifier module is connected to an input terminal of the control terminal amplifier module; a coupling terminal of the 90-degree differential coupler $Q_2$ includes one terminal connected to a first input terminal of the first driver amplifier module, and the other terminal connected to a second input terminal of the first driver amplifier module; a pass-through terminal of the 90-degree differential coupler $Q_2$ includes one terminal connected to a first input terminal of the second driver amplifier module, and the other terminal connected to a second input terminal of the second driver amplifier module; an output terminal of the first driver amplifier module is connected to an input terminal of the first balance terminal amplifier module; an output terminal of the second driver amplifier module is connected to an input terminal of the second balance terminal amplifier module; a first output terminal and a second output terminal of the first balance terminal amplifier module are respectively connected to one terminal of a pass-through terminal of the 90-degree differential coupler $Q_3$ and the other terminal of the pass-through terminal of the 90-degree differential coupler $Q_3$; the second balance terminal amplifier module includes a first output terminal connected to one terminal of a coupling terminal of the 90-degree differential coupler $Q_3$, and a second output terminal connected to the other terminal of the coupling terminal of the 90-degree differential coupler $Q_3$; an output terminal of the control terminal amplifier module is connected to an isolated terminal of the 90-degree differential coupler $Q_3$; and an output terminal of the 90-degree differential coupler $Q_3$ serves as an output terminal of the millimeter-wave LMBA based on the variable XCP.

Further, the ADB circuit includes a transistor $M_{4n}$, a resistor $R_{LP}$, a capacitor $C_{LP}$, a transistor $M_{4n}$, a transistor $M_{5n}$, a transistor $M_{6n}$, a transistor $M_{4p}$, a transistor $M_{5p}$, a transistor $M_{6p}$, a resistor R1, a resistor R2, a capacitor C1, a capacitor C2, a capacitor C3 and a capacitor C4; and the capacitor C1 includes one terminal serving as the input terminal of the ADB circuit, and the other terminal connected to one terminal of the resistor R1 and a base of the transistor $M_4$; the other terminal of the resistor R1 is connected to a detection voltage; an emitter of the transistor $M_4$ is grounded; a collector of the transistor $M_4$ is connected to one terminal of the resistor $R_{LP}$, one terminal of the capacitor $C_{LP}$, a base of the transistor $M_{4n}$, a base of the transistor $M_{5n}$, a base of the transistor $M_{6n}$, a base of the transistor $M_{4p}$, a base of the transistor $M_{5p}$, and a base of the transistor $M_{6p}$; the other terminal of the resistor $R_{LP}$ is connected to a 1V power supply and the other terminal of the capacitor $C_{LP}$; a collector of the transistor $M_{4p}$ is connected to a bias voltage $V_{cnt1}$; a collector of the transistor $M_{5p}$ is connected to the bias voltage $V_{cnt1}$; a collector of the transistor $M_{6p}$ is connected to a bias voltage $V_{cnt2}$; an emitter of the transistor $M_{4p}$ is connected to one terminal of the capacitor C4, one terminal of the resistor R2 and a collector of the transistor $M_{4n}$; the other terminal of the capacitor C4 is grounded; an emitter of the transistor $M_{4n}$ is grounded; an emitter of the transistor $M_{5p}$ is connected to one terminal of the capacitor C3, one terminal of the resistor R3 and a collector of the transistor $M_{5n}$; the other terminal of the capacitor C3 is grounded; an emitter of the transistor $M_5$. is grounded; an emitter of the transistor $M_{6p}$ is connected to one terminal of the capacitor C2, one terminal of the resistor R4 and a collector of the transistor $M_{6n}$; the other terminal of the capacitor C2 is grounded; an emitter of the transistor $M_{6n}$ is grounded; the other terminal of the resistor R2 serves as a first output terminal of the ADB circuit; the other terminal of the resistor R3 serves as a second output terminal of the ADB circuit; and the other terminal of the resistor R4 serves as a third output terminal of the ADB circuit.

Further, the first driver amplifier module includes a transformer Xfrm1 and a driver amplifier DA1; a primary side of the transformer Xfrm1 serves as an input terminal of the first driver amplifier module; a secondary side of the transformer Xfrm1 includes a first terminal connected to a first input terminal of the driver amplifier DA1, a second terminal connected to a second input terminal of the driver amplifier DA1, and a third terminal connected to an output terminal of the ADB circuit; and a first output terminal and a second output terminal of the driver amplifier DA1 are connected to the first balance terminal amplifier module.

Further, the second driver amplifier module includes a transformer Xfrm2 and a driver amplifier DA2; a primary side of the transformer Xfrm2 serves as an input terminal of the second driver amplifier module; a secondary side of the transformer Xfrm2 includes a first terminal connected to a first input terminal of the driver amplifier DA2, a second terminal connected to a second input terminal of the driver amplifier DA2, and a third terminal connected to the output terminal of the ADB circuit; and a first output terminal and a second output terminal of the driver amplifier DA2 are connected to the second balance terminal amplifier module.

Further, the third driver amplifier module includes a transformer Xfrm3 and a driver amplifier DA3; a primary side of the transformer Xfrm3 serves as an input terminal of the third driver amplifier module; a secondary side of the transformer Xfrm3 includes one terminal connected to a first input terminal of the driver amplifier DA3, and the other terminal connected to a second input terminal of the driver amplifier DA3; and a first output terminal and a second output terminal of the driver amplifier DA3 are connected to the variable XCP.

Further, the first balance terminal amplifier module includes a balance terminal amplifier BA1, a transformer Xfmr4, and a transformer Xfmr7; a primary side of the transformer Xfmr4 serves as an input terminal of the first balance terminal amplifier module; a secondary side of the transformer Xfmr4 includes a first terminal connected to a first input terminal of the balance terminal amplifier BA1, a second terminal connected to a second input terminal of the balance terminal amplifier BA1, and a third terminal connected to the output terminal of the ADB circuit; a first output terminal of the balance terminal amplifier BA1 is connected to one terminal of a primary side of the transformer Xfmr7; a second output terminal of the balance terminal amplifier BA1 is connected to the other terminal of the primary side of the transformer Xfmr7; and a secondary side of the transformer Xfmr7 includes one terminal connected to one terminal of a pass-through terminal of the 90-degree differential coupler $Q_3$, and the other terminal connected to the other terminal of the pass-through terminal of the 90-degree differential coupler $Q_3$.

Further, the second balance terminal amplifier module includes a balance terminal amplifier BA2, a transformer Xfmr5, and a transformer Xfmr8; a primary side of the transformer Xfmr5 serves as an input terminal of the second balance terminal amplifier module; a secondary side of the transformer Xfmr5 includes a first terminal connected to a first input terminal of the balance terminal amplifier BA2, a second terminal connected to a second input terminal of the balance terminal amplifier BA2, and a third terminal connected to the output terminal of the ADB circuit; a first output terminal of the balance terminal amplifier BA2 is connected to one terminal of a primary side of the transformer Xfmr8; a second output terminal of the balance terminal amplifier BA2 is connected to the other terminal of the primary side of the transformer Xfmr8; and a secondary side of the transformer Xfmr8 includes one terminal connected to one terminal of a coupling terminal of the 90-degree differential coupler $Q_3$, and the other terminal connected to the other terminal of the coupling terminal of the 90-degree differential coupler $Q_3$.

Further, the variable XCP includes a transistor $M_1$, a transistor $M_2$, and a transistor $M_3$; a base of the transistor $M_1$ is connected to the second output terminal of the driver amplifier DA3, a collector of the transistor $M_2$ and the control terminal amplifier module; a base of the transistor $M_2$ is connected to the first output terminal of the driver amplifier DA3, a collector of the transistor $M_1$ and the control terminal amplifier module; an emitter of the transistor $M_1$ is connected to a collector of the transistor $M_3$ and an emitter of the transistor $M_2$; an emitter of the transistor $M_3$ is grounded; and a base of the transistor $M_3$ is connected to the output terminal of the ADB circuit.

Further, the control terminal amplifier module includes a control terminal amplifier CA, a transformer Xfmr6, and a transformer Xfmr9; a primary side of the transformer Xfmr6 serves as an input terminal of the control terminal amplifier module; a secondary side of the transformer Xfmr6 includes one terminal connected to a first input terminal of the control terminal amplifier CA, and the other terminal connected to a second input terminal of the control terminal amplifier CA; a first output terminal of the control terminal amplifier CA is connected to one terminal of a primary side of the transformer Xfmr9; a second output terminal of the control terminal amplifier CA is connected to the other terminal of the primary side of the transformer Xfmr9; and a secondary side of the transformer Xfmr9 includes one terminal connected to one terminal of an isolated terminal of the 90-degree differential coupler $Q_3$, and the other terminal connected to the other terminal of the isolated terminal of the 90-degree differential coupler Q1.

The present disclosure has the following beneficial effects: With the variable XCP structure, the present disclosure makes a load impedance of a common-source amplifier increase with a power, thereby preventing a gain of the common-source amplifier from decreasing with the power. The present disclosure improves a linearity of the amplifier, without affecting an efficiency in a power back-off region.

DETAILED DESCRIPTION OF THE EMBODIMENTS

The specific embodiment of the present disclosure will be described below so that those skilled in the art can understand the present disclosure, but it should be clear that the present disclosure is not limited to the scope of the specific embodiment. For those of ordinary skill in the art, as long as various changes fall within the spirit and scope of the present disclosure defined and determined by the appended claims, these changes are apparent, and all inventions and creations using the concept of the present disclosure are protected.

Figure 1:
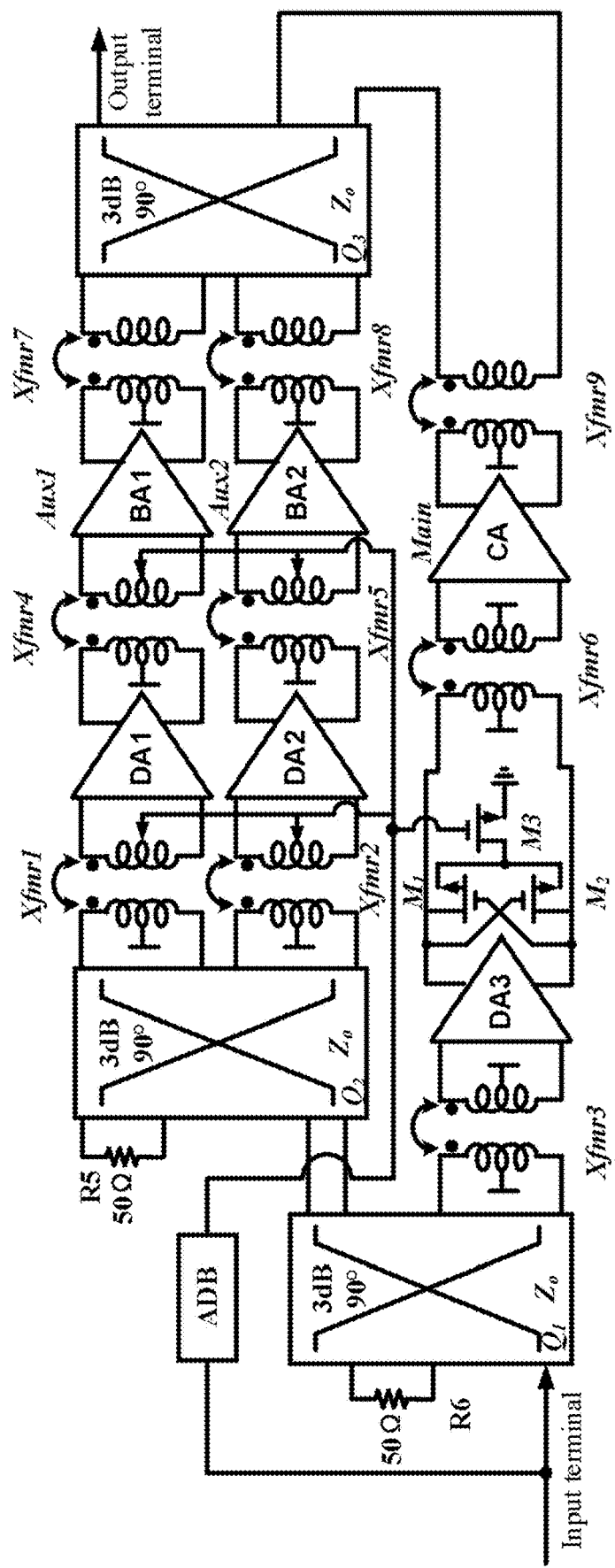
FIG. 1 is a structural view according to the present disclosure.

As shown in FIG. 1, an LMBA based on a variable XCP includes an ADB circuit, a first balance terminal amplifier module, a second balance terminal amplifier module, a control terminal amplifier module, a first driver amplifier module, a second driver amplifier module, a third driver amplifier module, a variable XCP, resistor R5, resistor R6, 90-degree differential coupler Q1, 90-degree differential coupler Q2, and 90-degree differential coupler Q3.

An input terminal of the ADB circuit and a third input terminal of the 90-degree differential coupler Q1 each serve as an input terminal of an amplifier. One terminal of an isolated terminal of the 90-degree differential coupler Q1 is connected to the other terminal of the isolated terminal of the 90-degree differential coupler Q1 through the resistor R5. A pass-through terminal of the 90-degree differential coupler Q1 includes one terminal connected to a first input terminal of the 90-degree differential coupler Q2, and the other terminal connected to a second input terminal of the 90-degree differential coupler Q2. One terminal of an isolated terminal of the 90-degree differential coupler Q2 is connected to the other terminal of the isolated terminal of the 90-degree differential coupler Q2 through the resistor R6. A third output terminal of the 90-degree differential coupler Q1 is connected to an input terminal of the third driver amplifier module. An output terminal of the third driver amplifier module is connected to an input terminal of the control terminal amplifier module. A coupling terminal of the 90-degree differential coupler Q2 includes one terminal connected to a first input terminal of the first driver amplifier module, and the other terminal connected to a second input terminal of the first driver amplifier module. A pass-through terminal of the 90-degree differential coupler $Q_2$ includes one terminal connected to a first input terminal of the second driver amplifier module, and the other terminal connected to a second input terminal of the second driver amplifier module. An output terminal of the first driver amplifier module is connected to an input terminal of the first balance terminal amplifier module. An output terminal of the second driver amplifier module is connected to an input terminal of the second balance terminal amplifier module. A first output terminal and a second output terminal of the first balance terminal amplifier module are respectively connected to one terminal of a pass-through terminal of the 90-degree differential coupler $Q_3$ and the other terminal of the pass-through terminal of the 90-degree differential coupler $Q_3$. The second balance terminal amplifier module includes a first output terminal connected to one terminal of a coupling terminal of the 90-degree differential coupler $Q_3$, and a second output terminal connected to the other terminal of the coupling terminal of the 90-degree differential coupler $Q_3$. An output terminal of the control terminal amplifier module is connected to an isolated terminal of the 90-degree differential coupler $Q_3$. An output terminal of the 90-degree differential coupler $Q_3$ serves as an output terminal of the millimeter-wave LMBA based on the variable XCP.

The first driver amplifier module includes transformer Xfrm1 and driver amplifier DA1. A primary side of the transformer Xfrm1 serves as an input terminal of the first driver amplifier module. A secondary side of the transformer Xfrm1 includes a first terminal connected to a first input terminal of the driver amplifier DA1, a second terminal connected to a second input terminal of the driver amplifier DA1, and a third terminal connected to an output terminal of the ADB circuit. A first output terminal and a second output terminal of the driver amplifier DA1 are connected to the first balance terminal amplifier module.

The second driver amplifier module includes transformer Xfrm2 and driver amplifier DA2. A primary side of the transformer Xfrm2 serves as an input terminal of the second driver amplifier module. A secondary side of the transformer Xfrm2 includes a first terminal connected to a first input terminal of the driver amplifier DA2, a second terminal connected to a second input terminal of the driver amplifier DA2, and a third terminal connected to the output terminal of the ADB circuit. A first output terminal and a second output terminal of the driver amplifier DA2 are connected to the second balance terminal amplifier module.

The third driver amplifier module includes transformer Xfrm3 and driver amplifier DA3. A primary side of the transformer Xfrm3 serves as an input terminal of the third driver amplifier module. A secondary side of the transformer Xfrm3 includes one terminal connected to a first input terminal of the driver amplifier DA3, and the other terminal connected to a second input terminal of the driver amplifier DA3. A first output terminal and a second output terminal of the driver amplifier DA3 are connected to the variable XCP.

The first balance terminal amplifier module includes balance terminal amplifier BA1, transformer Xfmr4, and transformer Xfmr7. A primary side of the transformer Xfmr4 serves as an input terminal of the first balance terminal amplifier module. A secondary side of the transformer Xfmr4 includes a first terminal connected to a first input terminal of the balance terminal amplifier BA1, a second terminal connected to a second input terminal of the balance terminal amplifier BA1, and a third terminal connected to the output terminal of the ADB circuit.

A first output terminal of the balance terminal amplifier BA1 is connected to one terminal of a primary side of the transformer Xfmr7. A second output terminal of the balance terminal amplifier BA1 is connected to the other terminal of the primary side of the transformer Xfmr7. A secondary side of the transformer Xfmr7 includes one terminal connected to one terminal of a pass-through terminal of the 90-degree differential coupler $Q_3$, and the other terminal connected to the other terminal of the pass-through terminal of the 90-degree differential coupler $Q_3$.

The second balance terminal amplifier module includes balance terminal amplifier BA2, transformer Xfmr5, and transformer Xfmr8. A primary side of the transformer Xfmr5 serves as an input terminal of the second balance terminal amplifier module. A secondary side of the transformer Xfmr5 includes a first terminal connected to a first input terminal of the balance terminal amplifier BA2, a second terminal connected to a second input terminal of the balance terminal amplifier BA2, and a third terminal connected to the output terminal of the ADB circuit.

A first output terminal of the balance terminal amplifier BA2 is connected to one terminal of a primary side of the transformer Xfmr8. A second output terminal of the balance terminal amplifier BA2 is connected to the other terminal of the primary side of the transformer Xfmr8. A secondary side of the transformer Xfmr8 includes one terminal connected to one terminal of a coupling terminal of the 90-degree differential coupler $Q_3$, and the other terminal connected to the other terminal of the coupling terminal of the 90-degree differential coupler $Q_3$.

The variable XCP includes transistor $M_1$, transistor $M_2$, and transistor $M_3$. A base of the transistor $M_1$ is connected to the second output terminal of the driver amplifier DA3, a collector of the transistor $M_2$ and the control terminal amplifier module. A base of the transistor $M_2$ is connected to the first output terminal of the driver amplifier DA3, a collector of the transistor $M_1$ and the control terminal amplifier module. An emitter of the transistor $M_1$ is connected to a collector of the transistor $M_3$ and an emitter of the transistor $M_2$. An emitter of the transistor $M_3$ is grounded. A base of the transistor $M_3$ is connected to the output terminal of the ADB circuit.

The control terminal amplifier module includes control terminal amplifier CA, transformer Xfmr6, and transformer Xfmr9. A primary side of the transformer Xfmr6 serves as an input terminal of the control terminal amplifier module. A secondary side of the transformer Xfmr6 includes one terminal connected to a first input terminal of the control terminal amplifier CA, and the other terminal connected to a second input terminal of the control terminal amplifier CA.

A first output terminal of the control terminal amplifier CA is connected to one terminal of a primary side of the transformer Xfmr9. A second output terminal of the control terminal amplifier CA is connected to the other terminal of the primary side of the transformer Xfmr9. A secondary side of the transformer Xfmr9 includes one terminal connected to one terminal of an isolated terminal of the 90-degree differential coupler $Q_3$, and the other terminal connected to the other terminal of the isolated terminal of the 90-degree differential coupler $Q_1$.

Figure 2:
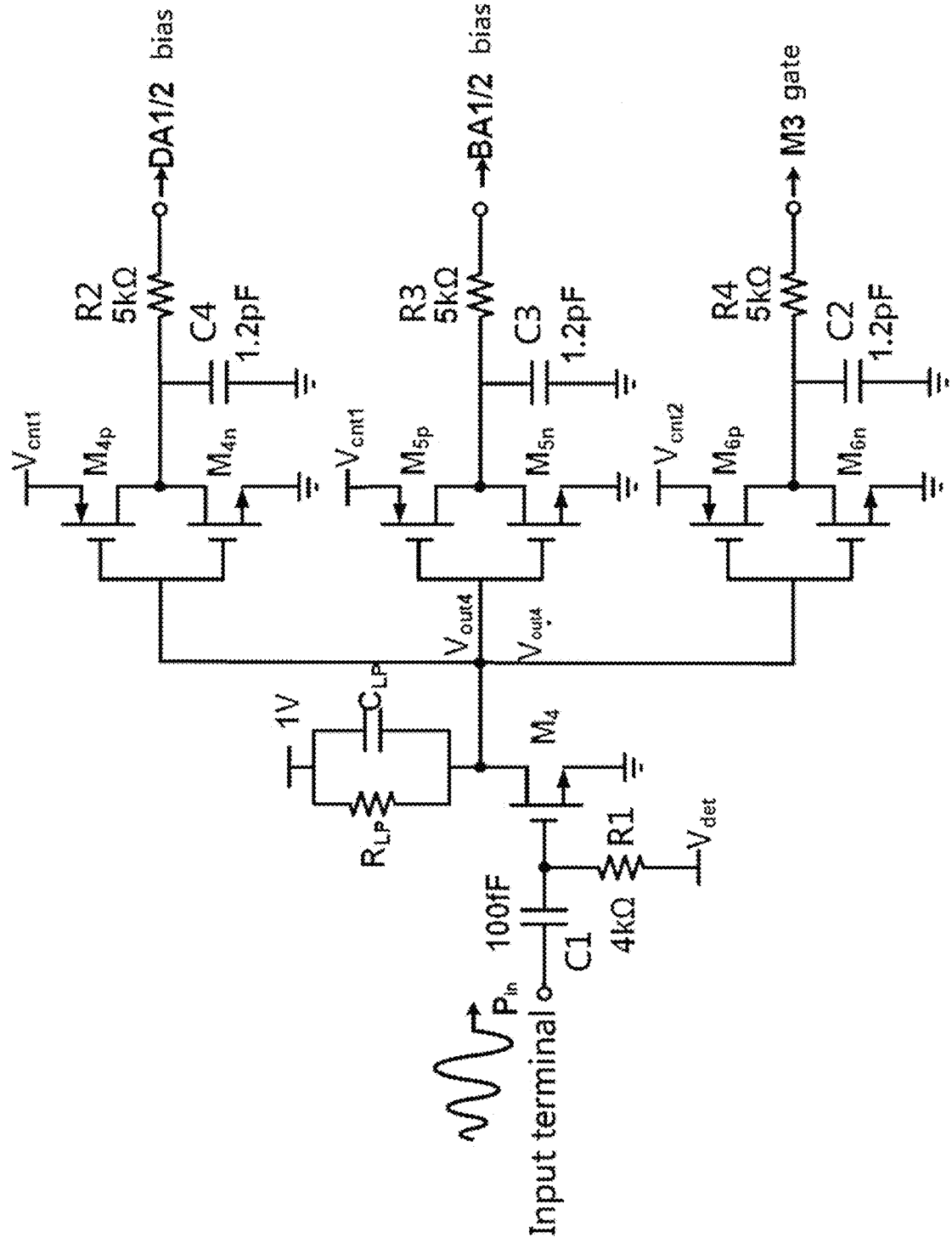
FIG. 2 is a schematic view of an ADB circuit.

As shown in FIG. 2, the ADB circuit includes transistor $M_{4n}$, resistor RLP, capacitor CLP, transistor $M_{4n}$, transistor $M_{5n}$, transistor $M_{6n}$, transistor $M_{4p}$, transistor $M_{5p}$, transistor $M_{6p}$, resistor R1, resistor R2, capacitor C1, capacitor C2, capacitor C3 and capacitor C4.

The capacitor C1 includes one terminal serving as the input terminal of the ADB circuit, and the other terminal connected to one terminal of the resistor R1 and a base of the transistor M4.

The other terminal of the resistor R1 is connected to a detection voltage. An emitter of the transistor M4 is grounded. A collector of the transistor M4 is connected to one terminal of the resistor $R_{LP}$, one terminal of the capacitor $C_{LP}$, a base of the transistor $M_{4n}$, a base of the transistor $M_5$n, a base of the transistor $M_6$n, a base of the transistor $M_{4p}$, a base of the transistor $M_{5p}$, and a base of the transistor $M_{6p}$. The other terminal of the resistor $R_{LP}$ is connected to a 1V power supply and the other terminal of the capacitor $C_{LP}$. A collector of the transistor $M_{4p}$ is connected to a bias voltage $V_0$nti. A collector of the transistor $M_{5p}$ is connected to the bias voltage $V_{cnt1}$. A collector of the transistor $M_{6p}$ is connected to a bias voltage $V_{cnt2}$. An emitter of the transistor $M_{4p}$ is connected to one terminal of the capacitor C4, one terminal of the resistor R2 and a collector of the transistor $M_4$n. The other terminal of the capacitor C4 is grounded. An emitter of the transistor $M_4$n is grounded. An emitter of the transistor $M_{5p}$ is connected to one terminal of the capacitor C3, one terminal of the resistor R3 and a collector of the transistor $M_{5n}$.

The other terminal of the capacitor C3 is grounded. An emitter of the transistor $M_{5n}$ is grounded. An emitter of the transistor $M_{6p}$ is connected to one terminal of the capacitor C2, one terminal of the resistor R4 and a collector of the transistor $M_{6n}$. The other terminal of the capacitor C2 is grounded. An emitter of the transistor $M_{6n}$ is grounded. The other terminal of the resistor R2 serves as a first output terminal of the ADB circuit. The other terminal of the resistor R3 serves as a second output terminal of the ADB circuit. The other terminal of the resistor R4 serves as a third output terminal of the ADB circuit.

Figure 3:
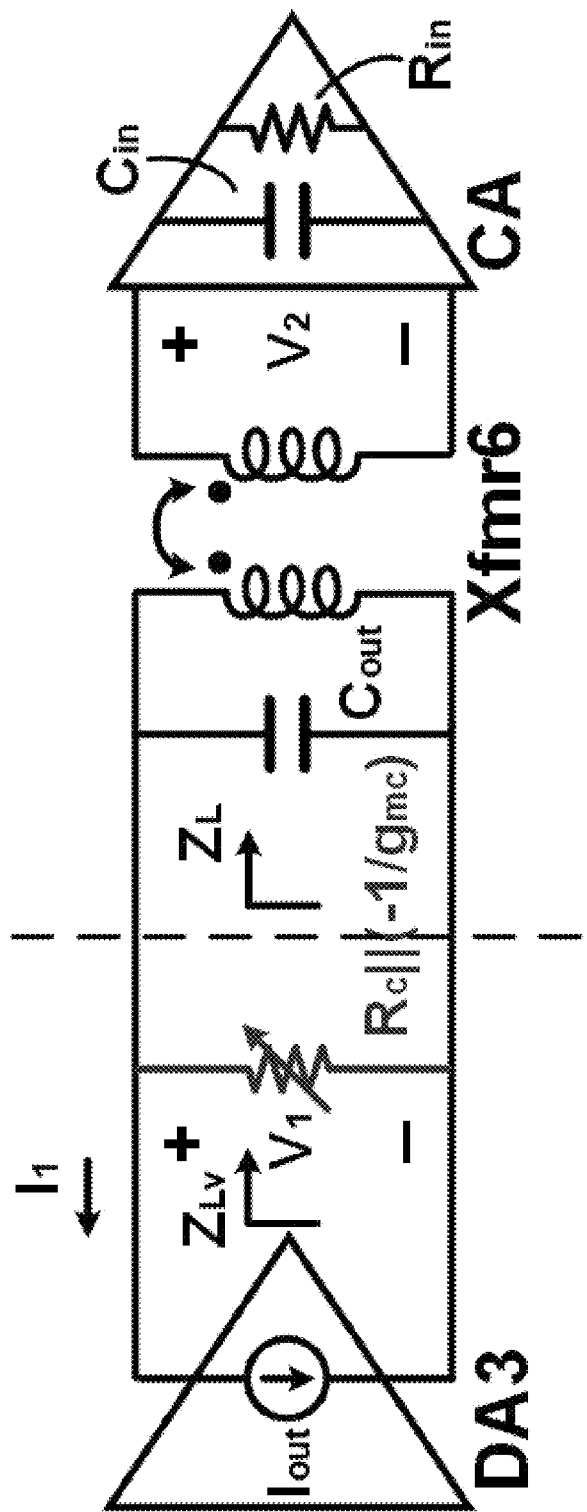
FIG. 3 is a schematic view of an equivalent circuit of a variable XCP.

As shown in FIG. 3, the driver amplifier DA3 can be equivalent to a current source $I_{out}$, with a parasitic capacitance Cout. The control terminal amplifier CA is equivalent to an input resistor $R_{in}$ and an input capacitor Cia. The variable XCP is equivalent to a variable resistor.

$$R_v = R_c \| \left(-\frac{1}{g_{mc}}\right) = \frac{R_c}{1 - g_{mc}R_c}$$

After the variable XCP is provided between DA3 and Xfmr6, a load impedance of the DA3 is changed from $Z_L$ to $Z_{Lv}$.

$$Z_L \to Z_{Lv} = R_v \| Z_L = \frac{Z_L R_c}{Z_L - R_c - g_{mc} Z_L R_c}$$

The DA3 linearly amplifies its input voltage $V_{in}$, with a transconductance Gm, thereby obtaining:

$$V_1 = I_{out} \times Z_{Lv} = G_m V_{in} Z_{Lv}$$

$$G_{DA3} = \frac{V_1}{V_{in}} = G_m Z_{Lv}.$$

Figure 4A:
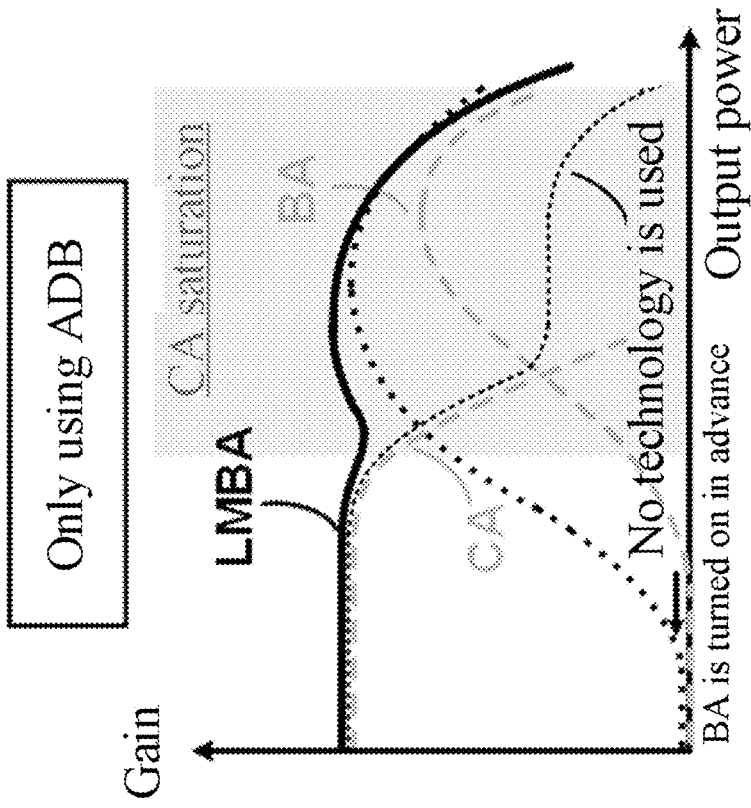
FIGS. 4A and 4B show a schematic view for improving a linearity with a variable XCP.
Figure 4B:
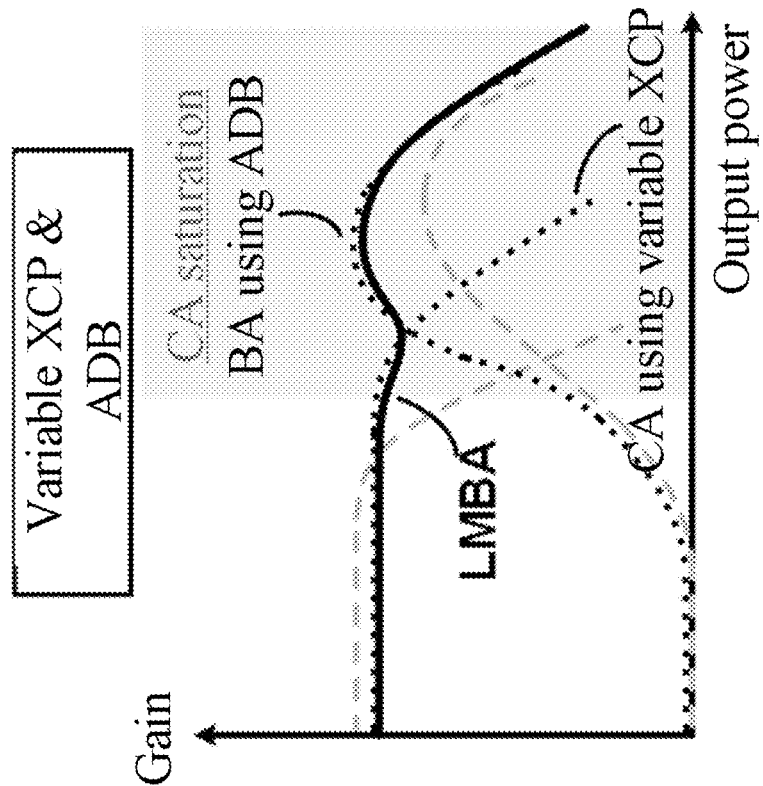

As shown in FIGS. 4A and 4B, the variable XCP structure improves a linearity of the control terminal amplifier CA in a saturation region. The BA1/2 using the ADB has a higher gain in the saturation region. With the variable XCP structure, the ADB voltage threshold is high, such that the BA1/2 is not turned on in advance to affect an efficiency in the power back-off region. FIG. 4B illustrates a solution in which an overall linearity is improved only with an ADB. Due to a large power back-off range, in order to compensate a gain of the CA in saturation and serious compression, the ADB voltage threshold is low to improve the gain of the turn-on BA. Consequently, the BA1/2 is turned on in advance to affect the power back-off efficiency.

Figure 5:
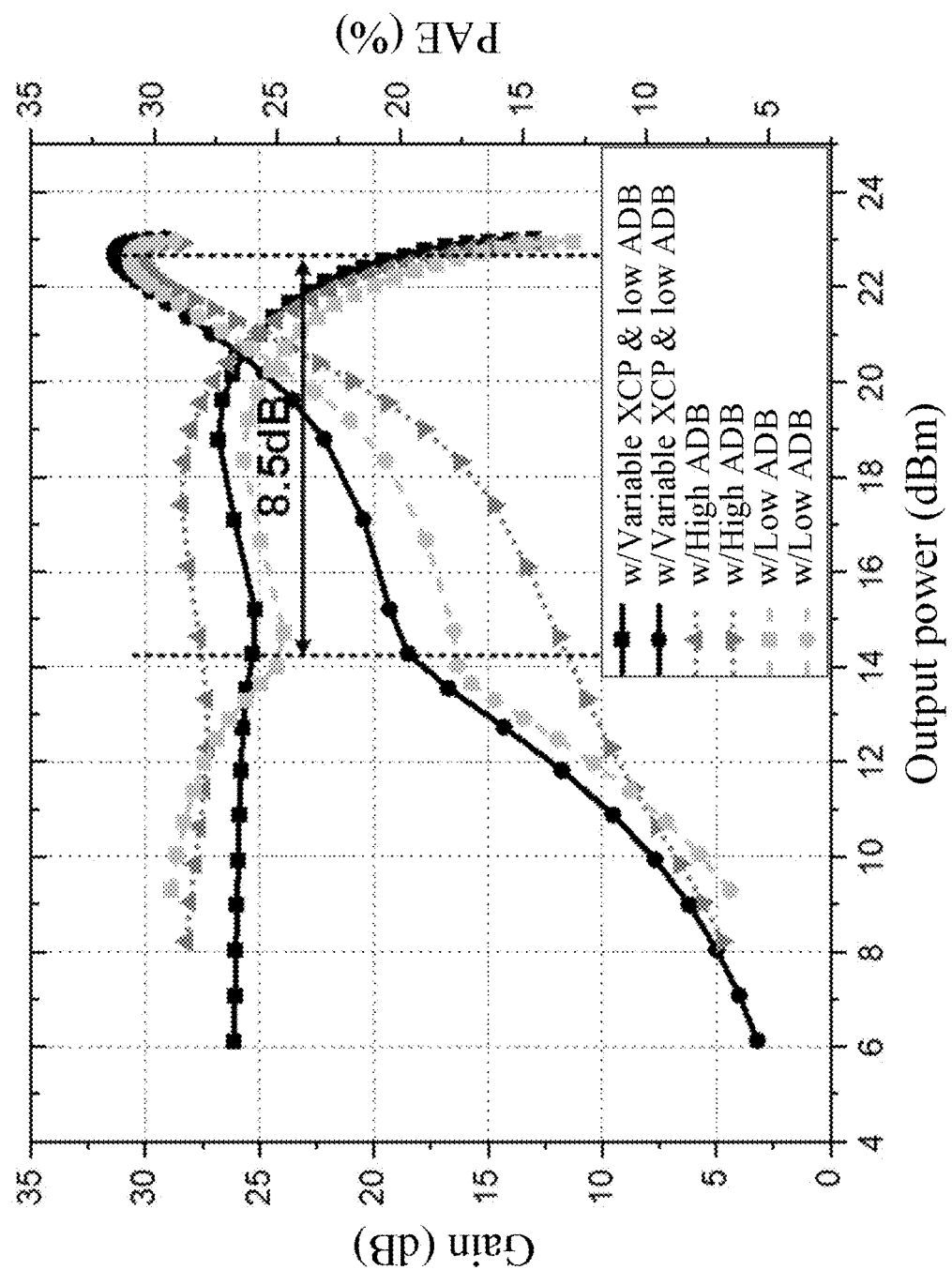
FIG. 5 illustrates a comparison in a linearity and a power added efficiency (PAE) according to whether a variable XCP is used by an LMBA.

As shown in FIG. 5, the solid line refers to a simulation test result when the variable XCP structure is used in the present disclosure, the dash line refers to a simulation test result when the variable XCP structure is not used under same circuit parameters, and a dotted line refers to a simulation test result when only the ADB is used to improve the linearity. In combination with the variable XCP structure and the ADB (the solid line), the overall linearity of the amplifier is improved. When the variable XCP structure is turned off, and the same ADB voltage threshold is used (the dash line), the linearity of the amplifier is affected, and the power back-off efficiency is reduced slightly. When the variable XCP structure is turned off, and the ADB voltage threshold is improved (the dotted line), the linearity of the amplifier is improved, but the power back-off efficiency is affected seriously. In combination with the variable XCP structure and the ADB, the BA1/2 is not turned on in advance for the high ADB voltage threshold to affect the power back-off efficiency.

In an embodiment of the present disclosure, the present disclosure has a higher power back-off efficiency at 28 GHz and 8.5 dB. Compared with the solution only using the ADB, the present disclosure based on the variable XCP structure improves a linearity of the millimeter-wave LMBA, while achieving a higher back-off efficiency. Through the ADB, a direct-current (DC) voltage increasing with an increase of an input signal power is output to control a gate of the transistor M3. With an increase of $g_{me}$, $Z_{Lv}$ increases. With the increase of the input signal power, $G_m$ decreases. Through opposite variation tendencies, $V_1$ is relatively stable. Therefore, the tendency in which the gain $G_{DA3}$ of the DA3 decreases with the increase of the input power is alleviated.

With the variable XCP structure, the present disclosure makes a load impedance of a common-source amplifier increase with a power, thereby preventing a gain of the common-source amplifier from decreasing with the power. The present disclosure improves a linearity of the amplifier, without affecting an efficiency in a power back-off region.

What is claimed is:

1. A load-modulated balanced amplifier (LMBA) based on a variable cross-coupled pair (XCP), comprising an adaptive bias (ADB) circuit, a first balance terminal amplifier module, a second balance terminal amplifier module, a control terminal amplifier module, a first driver amplifier module, a second driver amplifier module, a third driver amplifier module, a variable XCP, first resistor, a second resistor, a first 90-degree differential coupler, a second 90-degree differential coupler, and a third 90-degree differential coupler, wherein an input terminal of the ADB circuit and a third input terminal of the first 90-degree differential coupler each serve as an input terminal of an amplifier;

one terminal of an isolated terminal of the first 90-degree differential coupler is connected to the other terminal of the isolated terminal of the first 90-degree differential coupler through the first resistor;

a pass-through terminal of the first 90-degree differential coupler comprises one terminal connected to a first input terminal of the second 90-degree differential coupler, and the other terminal connected to a second input terminal of the second 90-degree differential coupler;

one terminal of an isolated terminal of the second 90-degree differential coupler is connected to the other terminal of the isolated terminal of the second 90-degree differential coupler through the second resistor;

a third output terminal of the first 90-degree differential coupler is connected to an input terminal of the third driver amplifier module;

an output terminal of the third driver amplifier module is connected to an input terminal of the control terminal amplifier module;

a coupling terminal of the degree differential coupler comprises one terminal connected to a first input terminal of the first driver amplifier module, and the other terminal connected to a second input terminal of the first driver amplifier module;

a pass-through terminal of the second 90-degree differential coupler comprises one terminal connected to a first input terminal of the second driver amplifier module, and the other terminal connected to a second input terminal of the second driver amplifier module;

an output terminal of the first driver amplifier module is connected to an input terminal of the first balance terminal amplifier module;

an output terminal of the second driver amplifier module is connected to an input terminal of the second balance terminal amplifier module;

a first output terminal and a second output terminal of the first balance terminal amplifier module are respectively connected to one terminal of a pass-through terminal of the third 90-degree differential coupler and the other terminal of the pass-through terminal of the third 90-degree differential coupler;

the second balance terminal amplifier module comprises a first output terminal connected to one terminal of a coupling terminal of the third 90-degree differential coupler, and a second output terminal connected to the other terminal of the coupling terminal of the third 90-degree differential coupler;

an output terminal of the control terminal amplifier module is connected to an isolated terminal of the third 90-degree differential coupler; and an output terminal of the third 90-degree differential coupler serves as an output terminal of the millimeter-wave LMBA based on the variable XCP.

2. The LMBA based on the variable XCP according to claim 1, wherein the ADB circuit comprises a first transistor, a third resistor, a first capacitor, a second transistor, a third transistor, a fourth transistor, a fifth transistor, a sixth transistor, a seventh transistor, a fourth resistor, a fifth resistor, a second capacitor, a third capacitor, a fourth capacitor and a fifth capacitor; and the second capacitor comprises one terminal serving as the input terminal of the ADB circuit, and the other terminal connected to one terminal of the fourth resistor and a base of the first transistor;

the other terminal of the fourth resistor is connected to a detection voltage;

an emitter of the first transistor is grounded;

a collector of the first transistor is connected to one terminal of the third resistor, one terminal of the first capacitor, a base of the second transistor, a base of the third transistor, a base of the fourth transistor, a base of the fifth transistor, a base of the sixth transistor, and a base of the seventh transistor;

the other terminal of the third resistor is connected to a 1V power supply and the other terminal of the first capacitor;

a collector of the fifth transistor is connected to a first bias voltage;

a collector of the sixth transistor is connected to the first bias voltage;

a collector of the seventh transistor is connected to a second bias voltage;

an emitter of the fifth transistor is connected to one terminal of the fifth capacitor, one terminal of the fifth resistor and a collector of the second transistor;

the other terminal of the fifth capacitor is grounded;

an emitter of the second transistor is grounded;

an emitter of the sixth transistor is connected to one terminal of the fourth capacitor, one terminal of the sixth resistor and a collector of the third transistor;

the other terminal of the fourth capacitor is grounded;

an emitter of the third transistor is grounded;
an emitter of the seventh transistor is connected to one terminal of the third capacitor, one terminal of the seventh resistor and a collector of the fourth transistor;
the other terminal of the third capacitor is grounded;
an emitter of the fourth transistor is grounded;
the other terminal of the fifth resistor serves as a first output terminal of the ADB circuit;
the other terminal of the sixth resistor serves as a second output terminal of the ADB circuit; and
the other terminal of the seventh resistor serves as a third output terminal of the ADB circuit.

3. The LMBA based on the variable XCP according to claim 1, wherein the first driver amplifier module comprises a first transformer and a first driver amplifier;
a primary side of the first transformer serves as an input terminal of the first driver amplifier module;
a secondary side of the first transformer comprises a first terminal connected to a first input terminal of the first driver amplifier, a second terminal connected to a second input terminal of the first driver amplifier, and a third terminal connected to an output terminal of the ADB circuit; and
a first output terminal and a second output terminal of the first driver amplifier are connected to the first balance terminal amplifier module.

4. The LMBA based on the variable XCP according to claim 3, wherein the second driver amplifier module comprises a second transformer and a second driver amplifier; a primary side of the second transformer serves as an input terminal of the second driver amplifier module; a secondary side of the second transformer comprises a first terminal connected to a first input terminal of the second driver amplifier, a second terminal connected to a second input terminal of the second driver amplifier, and a third terminal connected to the output terminal of the ADB circuit; and a first output terminal and a second output terminal of the second driver amplifier are connected to the second balance terminal amplifier module.

5. The LMBA based on the variable XCP according to claim 3, wherein the third driver amplifier module comprises a third transformer and a third driver amplifier; a primary side of the third transformer serves as an input terminal of the third driver amplifier module; a secondary side of the third transformer comprises one terminal connected to a first input terminal of the third driver amplifier, and the other terminal connected to a second input terminal of the third driver amplifier; and a first output terminal and a second output terminal of the third driver amplifier are connected to the variable XCP.

6. The LMBA based on the variable XCP according to claim 3, wherein the first balance terminal amplifier module comprises a first balance terminal amplifier, a fourth transformer, and a seventh transformer;
a primary side of the fourth transformer serves as an input terminal of the first balance terminal amplifier module;
a secondary side of the fourth transformer comprises a first terminal connected to a first input terminal of the first balance terminal amplifier, a second terminal connected to a second input terminal of the first balance terminal amplifier, and a third terminal connected to the output terminal of the ADB circuit;
a first output terminal of the first balance terminal amplifier is connected to one terminal of a primary side of the seventh transformer;
a second output terminal of the first balance terminal amplifier is connected to the other terminal of the primary side of the seventh transformer; and
a secondary side of the seventh transformer comprises one terminal connected to one terminal of a pass-through terminal of the third 90-degree differential coupler, and the other terminal connected to the other terminal of the pass-through terminal of the third 90-degree differential coupler.

7. The LMBA based on the variable XCP according to claim 3, wherein the second balance terminal amplifier module comprises a second balance terminal amplifier, a fifth transformer, and a eighth transformer;
a primary side of the fifth transformer serves as an input terminal of the second balance terminal amplifier module;
a secondary side of the fifth transformer comprises a first terminal connected to a first input terminal of the second balance terminal amplifier, a second terminal connected to a second input terminal of the second balance terminal amplifier, and a third terminal connected to the output terminal of the ADB circuit;
a first output terminal of the second balance terminal amplifier is connected to one terminal of a primary side of the eighth transformer;
a second output terminal of the second balance terminal amplifier is connected to the other terminal of the primary side of the eighth transformer; and
a secondary side of the eighth transformer comprises one terminal connected to one terminal of a coupling terminal of the third 90-degree differential coupler, and the other terminal connected to the other terminal of the coupling terminal of the third 90-degree differential coupler.

8. The LMBA based on the variable XCP according to claim 5, wherein the variable XCP comprises a eighth transistor, a ninth transistor, and a tenth transistor;
a base of the eighth transistor is connected to the second output terminal of the third driver amplifier, a collector of the ninth transistor and the control terminal amplifier module;
a base of the ninth transistor is connected to the first output terminal of the third driver amplifier, a collector of the eighth transistor and the control terminal amplifier module;
an emitter of the eighth transistor is connected to a collector of the tenth transistor and an emitter of the ninth transistor;
an emitter of the tenth transistor is grounded; and
a base of the tenth transistor is connected to the output terminal of the ADB circuit.

9. The LMBA based on the variable XCP according to claim 8, wherein the control terminal amplifier module comprises a control terminal amplifier, a sixth transformer, and a ninth transformer;
a primary side of the sixth transformer serves as an input terminal of the control terminal amplifier module;
a secondary side of the sixth transformer comprises one terminal connected to a first input terminal of the control terminal amplifier, and the other terminal connected to a second input terminal of the control terminal amplifier;
a first output terminal of the control terminal amplifier is connected to one terminal of a primary side of the ninth transformer;

a second output terminal of the control terminal amplifier is connected to the other terminal of the primary side of the ninth transformer; and a secondary side of the ninth transformer comprises one terminal connected to one terminal of the isolated terminal of the third 90-degree differential coupler, and the other terminal connected to the other terminal of the isolated terminal of the first 90-degree differential coupler.

* * * * *